(12) United States Patent
Han et al.

(10) Patent No.: US 11,271,543 B2
(45) Date of Patent: Mar. 8, 2022

(54) BULK ACOUSTIC WAVE RESONATOR

(71) Applicant: Samsung Electro-Mechanics Co., Ltd., Suwon-si (KR)

(72) Inventors: Won Han, Suwon-si (KR); Sang Uk Son, Suwon-si (KR); Tae Yoon Kim, Suwon-si (KR); Jong Woon Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 697 days.

(21) Appl. No.: 16/193,529

(22) Filed: Nov. 16, 2018

(65) Prior Publication Data
US 2019/0253036 A1 Aug. 15, 2019

(30) Foreign Application Priority Data

Feb. 13, 2018 (KR) .................. 10-2018-0017538
Jun. 11, 2018 (KR) .................. 10-2018-0066617

(51) Int. Cl.
*H03H 9/17* (2006.01)
*H03H 9/13* (2006.01)
*H03H 9/02* (2006.01)

(52) U.S. Cl.
CPC ........ *H03H 9/177* (2013.01); *H03H 9/02118* (2013.01); *H03H 9/132* (2013.01); *H03H 9/173* (2013.01)

(58) Field of Classification Search
CPC .... H03H 9/177; H03H 9/02118; H03H 9/173; H03H 9/132; H03H 9/02015; H03H 9/02047; H03H 9/02086
See application file for complete search history.

(56) References Cited

U.S. PATENT DOCUMENTS

| 6,396,200 | B2 | 5/2002 | Misu et al. |
| 7,280,007 | B2 | 10/2007 | Feng et al. |
| 7,567,023 | B2 | 7/2009 | Iwaki et al. |

(Continued)

FOREIGN PATENT DOCUMENTS

| JP | 2005-159717 A | 6/2005 |
| JP | 2009-201101 A | 9/2009 |

(Continued)

OTHER PUBLICATIONS

Korean Office Action dated May 23, 2019 in counterpart Korean Patent Application No. 10-2018-0066617 (6 pages in English and 5 pages in Korean).

*Primary Examiner* — Jeffrey M Shin
(74) *Attorney, Agent, or Firm* — NSIP Law

(57) ABSTRACT

A bulk acoustic wave resonator includes: a substrate; a first electrode disposed above the substrate; a piezoelectric layer disposed above at least a portion of the first electrode; and a second electrode disposed above at least a portion of the piezoelectric layer. A first gap is formed between the piezoelectric layer and one of the first and second electrodes. The first gap includes a first inner gap disposed in an active area of the bulk acoustic wave resonator, and having a first spacing distance between the piezoelectric layer and the one of the first and second electrodes, and a first outer gap disposed outwardly of the active area and having a second spacing distance, different than the first spacing distance, between the piezoelectric layer and the one of the first and second electrodes.

16 Claims, 8 Drawing Sheets

(56) References Cited

U.S. PATENT DOCUMENTS

| | | |
|---|---|---|
| 8,085,115 B2 | 12/2011 | Taniguchi et al. |
| 8,248,185 B2 | 8/2012 | Choy et al. |
| 8,450,906 B2 | 5/2013 | Taniguchi et al. |
| 2012/0161902 A1 | 6/2012 | Feng et al. |
| 2015/0349747 A1 | 12/2015 | Burak et al. |
| 2016/0035960 A1 | 2/2016 | Lee et al. |
| 2017/0310303 A1* | 10/2017 | Thalhammer .......... H03H 9/173 |
| 2018/0013401 A1 | 1/2018 | Lee et al. |

FOREIGN PATENT DOCUMENTS

| | | |
|---|---|---|
| JP | 2013-138425 A | 7/2013 |
| KR | 10-2016-0015628 A | 2/2016 |
| KR | 10-2018-0006248 A | 1/2018 |

\* cited by examiner

BULK ACOUSTIC WAVE RESONATOR

CROSS-REFERENCE TO RELATED APPLICATIONS

This application claims benefit under 35 U.S.C. § 119(a) of Korean Patent Application Nos. 10-2018-0017538 and 10-2018-0066617 filed on Feb. 13, 2018 and Jun. 11, 2018, respectively, in the Korean Intellectual Property Office, the entire disclosures of which are incorporated herein by reference for all purposes.

BACKGROUND

1. Field

The following description relates to a bulk acoustic wave resonator.

2. Description of Related Art

A bulk acoustic wave (BAW) filter is a core component, which allows a desired frequency band of an RF signal to pass therethrough while blocking a signal in an unwanted frequency band. The BAW filter may be implemented in a front end module in which an input/output signal processor of a transmission/reception terminal of a smartphone, a table PC, or the like, is integrated. Demand for BAW filters is increasing with the recent growth in the mobile device market.

To keep pace with the 5G band (5 GHz or 28 GHz) communications into the future, frequencies utilized in a BAW filter should be higher. Since an overall thickness of the BAW filter should decrease when a frequency is increased, there is a need to use a substantially thin electrode. In the actual 5G band, an electrode may be thin and resistance may be increased. As a result, a Q factor decreases at a resonance point.

In view of the foregoing, an air-gap resonator structure, in which an air gap is formed above or below a conventional piezoelectric material to serve as a capacitor, has been proposed. However, in such a structure, separate structures (a frame, an air wing, an air bridge, and the like) should be provided on an outer side of a resonator to eliminate lateral wave leakage. In such a structure, separate structures may render manufacturing processes complex and reflection efficiency low. As a result, a Q factor may decrease at an antiresonance point.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes: a substrate; a first electrode disposed above the substrate; a piezoelectric layer disposed above at least a portion of the first electrode; and a second electrode disposed above at least a portion of the piezoelectric layer. A first gap is formed between the piezoelectric layer and one of the first and second electrodes. The first gap includes a first inner gap disposed in an active area of the bulk acoustic wave resonator, and having a first spacing distance between the piezoelectric layer and the one of the first and second electrodes, and a first outer gap disposed outwardly of the active area and having a second spacing distance, different than the first spacing distance, between the piezoelectric layer and the one of the first and second electrodes.

The first spacing distance may be less than the second spacing distance.

The first gap may be formed between the piezoelectric layer and the second electrode.

The first electrode and the piezoelectric layer may be spaced apart from each other by a constant distance.

The first gap may be formed between the piezoelectric layer and the first electrode.

The second electrode and the piezoelectric layer may be spaced apart from each other by a constant distance.

The one of the first and second electrodes may include an inclined surface that forms the first outer gap.

The piezoelectric layer may include an inclined surface that forms the first outer gap.

The one of the first and second electrodes may have a curved surface that forms the first outer gap.

The first spacing distance may be greater than the second spacing distance.

The bulk acoustic wave resonator may further include a surface treatment layer disposed on the piezoelectric layer.

The first gap may be filled with a gas having a dielectric constant higher than a dielectric constant of air.

The bulk acoustic wave resonator may further include: a spacer disposed between the piezoelectric layer and the one of the first and second electrodes.

A second gap may be formed between the piezoelectric layer and the other of the first and second electrodes. The second gap may include a second inner gap disposed in the active area, and having a third spacing distance between the piezoelectric layer and the other of the first and second electrodes, and a second outer gap disposed outwardly of the active area and having a fourth spacing distance, different than the third spacing distance, between the piezoelectric layer and the other of the first and second electrodes.

In another general aspect, a bulk acoustic wave resonator includes: a substrate; a first electrode disposed over the substrate; a piezoelectric layer disposed over at least a portion of the first electrode; and a second electrode disposed over at least a portion of the piezoelectric layer, wherein a portion of at least one of the first and second electrodes is spaced apart from the piezoelectric layer, wherein the piezoelectric layer and the at least one of the first and second electrodes form a first capacitor portion having a first capacitance and a second capacitor portion having a second capacitance different from the first capacitance, and wherein the first capacitor portion is disposed in an active area of the bulk acoustic wave resonator and the second capacitor portion is disposed outwardly of the active area.

The at least one of the first and second electrodes may include a stepped portion or an inclined portion disposed at a boundary of the active area.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
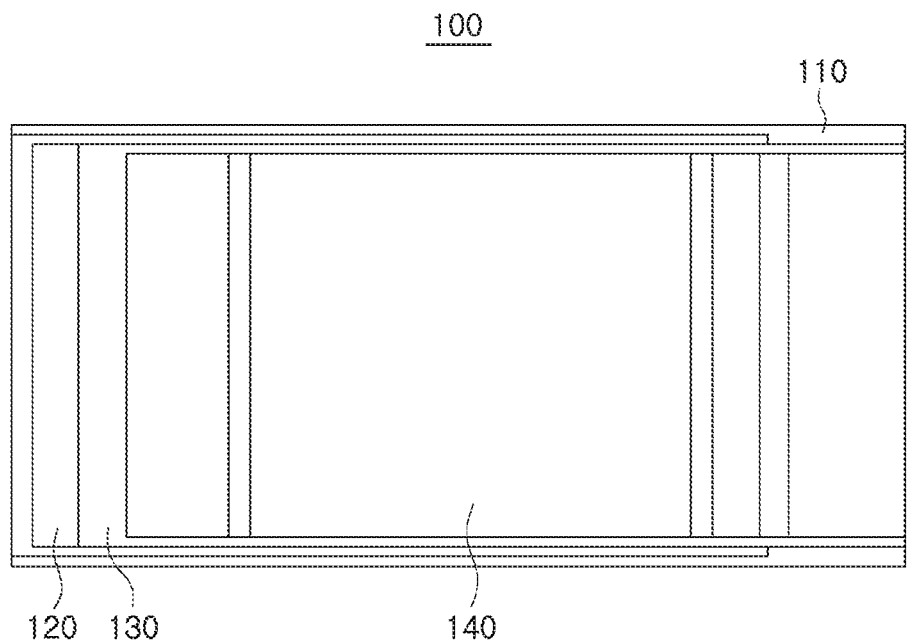
FIG. 1 is a schematic plan view of a bulk acoustic wave resonator, according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
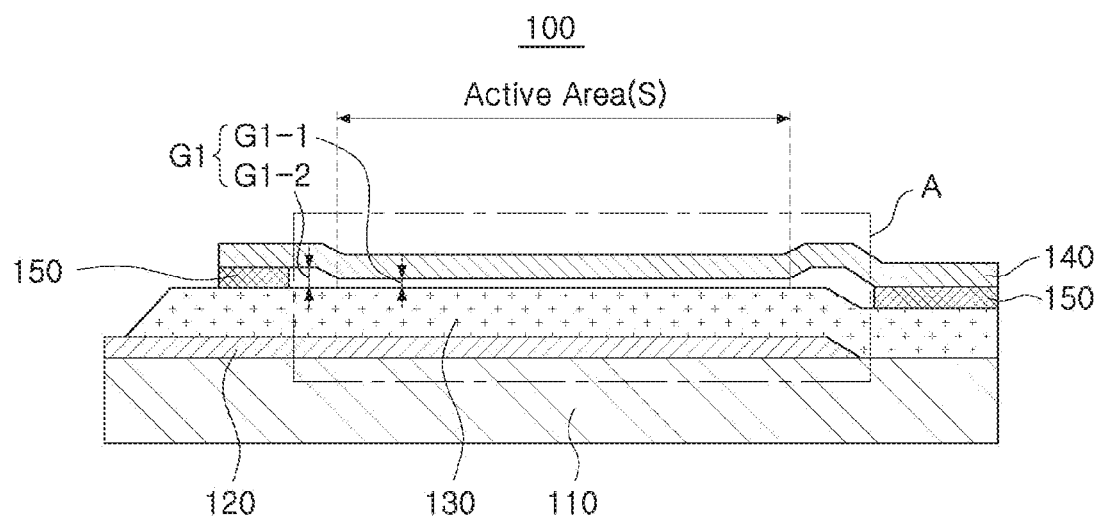
FIG. 2 is a cross-sectional view of the bulk acoustic wave resonator of FIG. 1.
Figure 3:
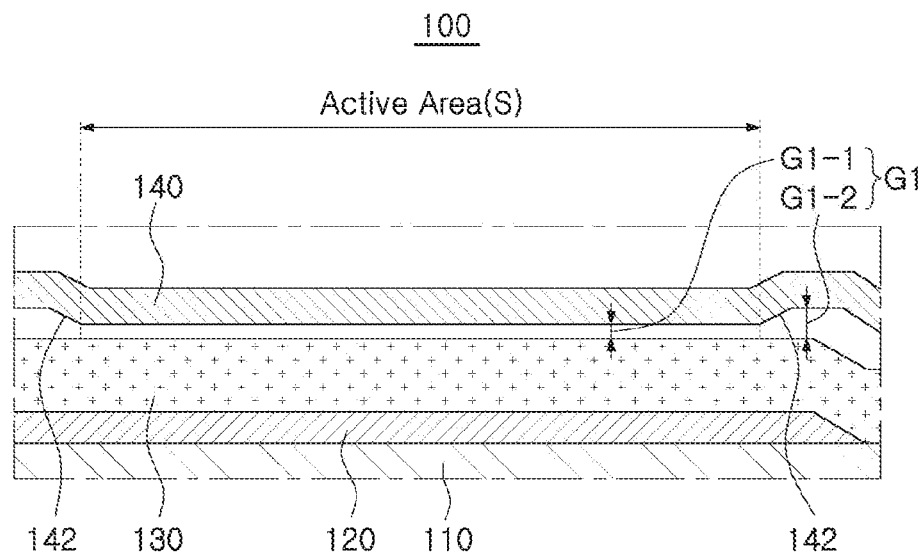
FIG. 3 is an enlarged view of portion 'A' in FIG. 2.

FIG. 1 is a schematic plan view of a bulk acoustic wave resonator 100, according to an example. FIG. 2 is a cross-sectional view of the bulk acoustic wave resonator 100. FIG. 3 is an enlarged view of portion 'A' in FIG. 2.

Referring to FIGS. 1 to 3, the bulk acoustic wave resonator 100 may include a substrate 110, a first electrode 120, a piezoelectric layer 130, a second electrode 140, and a spacer 150.

The substrate 110 may be a silicon wafer. For example, a silicon wafer or a silicon-on-insulator (SOI) substrate may be used as the substrate 110.

An insulating layer (not shown) may be provided on a top surface of the substrate 110 to electrically isolate overlying components/elements and the substrate 110 from each other. The insulating layer prevents the substrate 110 from being etched by an etching gas when a first gap G1 (FIGS. 2 and 3) is formed during a manufacturing process. The first gap G1 will be described later.

In this case, the insulating layer may be formed of any one or any combination of any two or more of silicon dioxide ($SiO_2$), silicon nitride ($Si_3N_4$), aluminum oxide ($Al_2O_3$), and aluminum nitride (AlN), and may be formed on the substrate 110 through any one of chemical vapor deposition, RF magnetron sputtering, and evaporation.

The first electrode 120 is disposed on the substrate 110. For example, the first electrode 120 may be formed of a conductive material such as molybdenum (Mo), ruthenium (Ru), tungsten (W), iridium (Ir), platinum (Pt) or the like, or alloys containing any one thereof.

The first electrode 120 may be used as either an input electrode or an output electrode configured to receive or provide an electrical signal such as a radio-frequency (RF) signal or the like.

The piezoelectric layer 130 is disposed on at least a portion of the first electrode 120. The piezoelectric layer 130 converts a signal input through the bottom electrode 130 or the top electrode 150 into an acoustic wave. For example, the piezoelectric layer 140 is configured to convert electrical energy into mechanical energy in the form of an acoustic wave, which is a piezoelectric effect. As an example, the piezoelectric layer 130 is formed of one of aluminum nitride (AlN), zinc oxide (ZnO), and lead zirconate titanate (PbZr-TiO (PZT)). The piezoelectric layer 130 may further include a rare earth metal. As an example, the piezoelectric layer 130 may include any one or any combination of any two or more of scandium (Sc), erbium (Er), yttrium (Y), and lanthanum (La). The piezoelectric layer 130 may include a transition metal. As an example, the transition metal may include any one or any combination of any two or more of zirconium (Zr), hafnium (Hf), tantalum (Ta), and niobium (Nb). Also the piezoelectric layer 130 may include a divalent metal such as magnesium (Mg).

The second electrode 140 is disposed on at least a portion of the piezoelectric layer 130. The second electrode 140 may be used as either an input electrode or an output electrode configured to receive or provide an electrical signal such as a radio-frequency (RF) signal or the like. For example, the second electrode 140 may be used as an output electrode when the first electrode 120 is used as an input electrode, and may be used as an input electrode when the first electrode 120 is used as an output electrode.

Similarly to the bottom electrode 120, the top electrode 140 may be formed of a conductive material such as molybdenum (Mo), ruthenium (Ru), tungsten (W), iridium (Ir), platinum (Pt) or the like, or alloys thereof.

Referring to FIGS. 2 and 3, the second electrode 140 and the piezoelectric layer 130 are spaced apart from each other in a portion to form a first gap G1. The first gap G1 may include an inner gap G1-1 disposed in an active area S and an outer gap G1-2 disposed outwardly of the active area S. To form the outer gap G1-2, as shown in FIG. 3, an inclined surface 142 is formed on the second electrode 140. The inclined surface 142 may be included in the second electrode 140 such that the inclined surface 142 is disposed outwardly of the active area S.

The active area S shown in FIG. 2 is an area in which the same frequency is generated. An area in which the inner gap G1-1 is formed is referred to as a first area, and an area in which the outer gap G1-2, which has a spacing distance (a distance between the top surface of the piezoelectric layer 130 and a bottom surface of the second electrode 140) different from a spacing distance of the inner gap G1-1, is formed is referred to as a second area.

The inner gap G1-1 may be formed to achieve a high Q factor. For example, the inner gap G1-1 may act as a capacitor to achieve a high Q factor even in a high frequency band.

When the inner gap G1-1 is reduced to have high capacitance, signal loss may be reduced in a high frequency band. Thus, reflection efficiency of a vertical wave generated at a boundary between the piezoelectric layer 130 and the inner gap G1-1 during resonance may be improved to achieve a high Q factor.

Since a frequency of the bulk acoustic wave resonator 100 is only affected by a thickness of the piezoelectric layer 130, a thickness of the second electrode 140 may increase in such a structure. Accordingly, resistance formed by the second electrode 140 may be reduced without being limited by a frequency. As a result, a high Q factor may be achieved at a resonance point.

Moreover, since the first gap G1 includes the inner gap G1-2, energy leakage caused by a lateral wave generated during resonance driving may be reduced. Accordingly, the lateral wave is reflected from a boundary surface causing a difference in an electric field applied to the piezoelectric layer 130 to achieve a high Q factor at an antiresonance point. For example, since a capacitance varies rapidly on a boundary surface of the inner gap G1-1, a lateral wave may be reflected to achieve a high Q factor at the antiresonance point.

For example, a first capacitor portion is formed in an area in which the inner gap G1-1 is formed, and a second capacitor portion having a capacitance different from a capacitance of the first capacitor portion is formed outwardly of the inner gap G1-1. Accordingly, the high Q factor may be achieved in the antiresonance portion.

The spacer 150 may be disposed between the second electrode 140 and the piezoelectric layer 130. The spacer 150 is disposed to cover the second gap G2. After the spacer 150 is laminated on the piezoelectric layer 140, only a portion of the spacer 150 is removed to form the inner gap G1-1. As an example, the spacer 150 may be formed of an insulator such as silicon oxide ($SiO_2$), silicon nitride ($Si_3N_4$), aluminum oxide ($Al_2O_3$), aluminum nitride (AlN), and the like. Alternatively, the spacer 150 may be formed of a conductor such as molybdenum (Mo), ruthenium (Ru), tungsten (W), iridium (Ir), platinum (Pt), aluminum (Al) or the like.

As described above, since the first gap G1 includes the inner gap G1-1 and the outer gap G1-2, a high Q factor may be achieved at an antiresonance point. Further, since the bulk acoustic wave resonator 100 may be manufactured in such a manner that a high Q factor is achieved at an antiresonance point through the first gap G1 including the inner gap G1-1 and the outer gap G1-2, the bulk acoustic wave resonator 100 may be easily manufactured and may be precisely manufactured in an RF field.

The example of FIGS. 1 to 3 has been described with respect to a configuration in which the second electrode 140 is provide with the inclined surface 142, but is not limited to this configuration. For example, the second electrode 140 may be provided with a stepped portion instead of an inclined surface, and thus the inner gap G1-1 and the outer gap G1-2 may be formed.

FIG. 1 shows a configuration in which the bulk acoustic wave resonator 100 has a substantially square planar shape, but the bulk acoustic wave resonator 100 is not limited to such a shape. For example, the bulk acoustic wave resonator 100 may have various planar shapes such as a polygonal shape, an irregular polygonal shape, a circular shape, an elliptical shape, and an irregularly curved shape.

Figure 4:
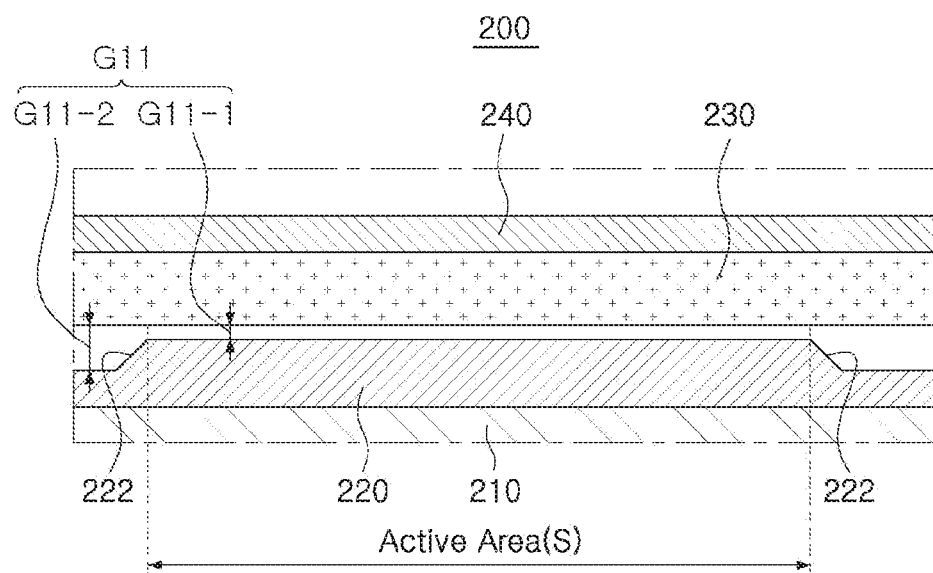
FIG. 4 is an explanatory view of a bulk acoustic wave resonator, according to an example.

FIG. 4 is an explanatory view of a bulk acoustic wave resonator 200, according to an example.

Referring to FIG. 4, the bulk acoustic wave resonator 200 includes a first electrode 220 and a piezoelectric layer 230 that are spaced apart from each other in a portion to form a first gap G11. The first electrode 220 may be disposed on a substrate 210.

The first gap G11 may include an inner gap G11-1 disposed in an active area S and an outer gap G11-2, disposed outwardly of the active area S. To form the outer gap G11-2, an inclined surface 222 is formed on the first electrode 220. The inclined surface 222 may be included in the first electrode 220 such that the inclined surface 222 is disposed outwardly of the active area S. In another example, the first electrode 220 may include a stepped portion or a differently shaped portion, instead of the inclined surface 222.

The inner gap G11-1 may be provided to achieve a high Q factor. For example, the inner gap G11-1 may act as a capacitor to achieve a high Q factor even in a high frequency band.

When the inner gap G11-1 is reduced to have high capacitance, signal loss may be reduced in a high frequency band. Thus, reflection efficiency of a vertical wave generated at a boundary between the piezoelectric layer 230 and the inner gap G11-1 during resonance may be improved to achieve a high Q factor.

Since a frequency of the bulk acoustic wave resonator 200 is only affected by a thickness of the piezoelectric layer 230, a thickness of the second electrode 240 may increase in such a structure. Accordingly, resistance formed by a second electrode 240 may be reduced without being limited by a frequency. As a result, a high Q factor may be achieved at a resonance point.

Moreover, since the first gap G11 includes the outer gap G11-2, energy leakage caused by a lateral wave generated during resonance driving may be reduced. Accordingly, the lateral wave is reflected from a boundary surface causing a difference in an electric field applied to the piezoelectric layer 230 to achieve a high Q factor at an antiresonance point. For example, since a capacitance varies rapidly on a boundary surface of the inner gap G11-1, a lateral wave may be reflected to achieve a high Q factor at the antiresonance point.

For example, a first capacitor portion is formed in an area in which the inner gap G11-1 is formed, and a second capacitor portion having a capacitance different from a capacitance of the first capacitor portion is formed outwardly of the inner gap G11-1. Accordingly, the high Q factor may be achieved in the antiresonance portion.

Figure 5:
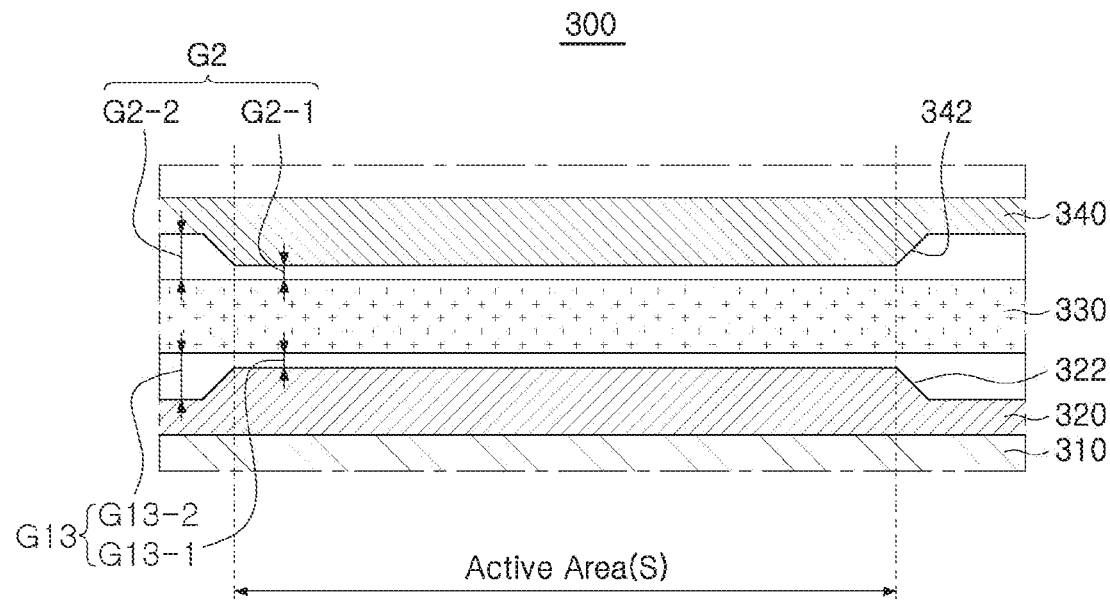
FIG. 5 is an explanatory view of a bulk acoustic wave resonator, according to an example.

FIG. 5 is an explanatory view of a bulk acoustic wave resonator 300, according to an example.

Referring to FIG. 5, the bulk acoustic wave resonator 300 may include a first electrode 320 and a piezoelectric layer 330 that are spaced apart from each other in a portion to form a first gap G13. The piezoelectric layer 330 and a second electrode 340 are spaced apart from each other in a portion to form a second gap G2. That is, the first gap G13 is formed between a lower surface of the piezoelectric layer 330 and an upper surface of the first electrode 320, and the second gap G2 is disposed between an upper surface of the piezoelectric layer 330 and a lower surface of the second electrode 340. The first electrode 320 may be disposed on a substrate 310.

The first gap G13 may include an inner gap G13-1 disposed in an active area S and an outer gap G13-2 disposed outwardly of the active area S. To form the outer gap G13-2, an inclined surface 322 is formed on the first electrode 320. The inclined surface 322 may be included in the first electrode 320 to be disposed outwardly of the active area S.

The inner gap G13-1 may be provided to achieve a high Q factor. For example, the inner gap G13-1 may act as a capacitor to achieve a high Q factor even in a high frequency band.

When the inner gap G13-1 is reduced to have high capacitance, signal loss may be reduced in a high frequency band. Thus, reflection efficiency of a vertical wave generated at a boundary between the piezoelectric layer 330 and the inner gap G13-1 during resonance may be improved to achieve a high Q factor.

Since a frequency of the bulk acoustic wave resonator 300 is only affected by a thickness of the piezoelectric layer 330, a thickness of the second electrode 340 may increase in such a structure. Accordingly, resistance formed by the second electrode 340 may be reduced without being limited by a frequency. As a result, a high Q factor may be achieved at a resonance point.

Moreover, since the first gap G13 includes the outer gap G13-2, energy leakage caused by a lateral wave generated during resonance driving may be reduced. Accordingly, the lateral wave is reflected from a boundary surface causing a difference in an electric field applied to the piezoelectric layer 330 to achieve a high Q factor at an antiresonance point. For example, since a capacitance varies rapidly on a boundary surface of the inner gap G13-1, a lateral wave may be reflected to achieve a high Q factor at the antiresonance point.

For example, a first capacitor portion is formed in an area in which the inner gap G13-1 is formed, and a second capacitor portion having a capacitance different from a capacitance of the first capacitor portion is formed outwardly of the inner gap G13-1. Accordingly, the high Q factor may be achieved in the antiresonance portion.

The second electrode 340 and the piezoelectric layer 330 are spaced apart from each other in a portion to form a second gap G2. The second gap G2 may include an inner gap G2-1 disposed in the active area S and an outer gap G2-2 disposed outwardly of the active area S. To form the outer gap G2, an inclined surface 342 is formed on the second electrode 340. The inclined surface 342 may be included in the second electrode 340 such that the inclined surface 342 is disposed outwardly of the active area S.

The inner gap G2-1 may be provided to achieve a high Q factor. For example, the inner gap G2-1 may act as a capacitor to achieve a high Q factor even in a high frequency band.

When the inner gap G2-1 is reduced to have high capacitance, signal loss may be reduced in a high frequency band. Thus, reflection efficiency of a vertical wave generated at a boundary between the piezoelectric layer 330 and the inner gap G2-1 during resonance may be improved to achieve a high Q factor.

Since a frequency of the bulk acoustic wave resonator 300 is only affected by a thickness of the piezoelectric layer 330, a thickness of the second electrode 340 may increase in such a structure. Accordingly, resistance formed by the second electrode 340 may be reduced without being limited by a frequency. As a result, a high Q factor may be achieved at a resonance point.

Moreover, since the second gap G2 includes the outer gap G2-2, energy leakage caused by a lateral wave generated during resonance driving may be reduced. Accordingly, the lateral wave is reflected from a boundary surface causing a difference in an electric field applied to the piezoelectric layer 330 to achieve a high Q factor at an antiresonance point. For example, since a capacitance varies rapidly at a boundary surface of the inner gap G2-1, a lateral wave may be reflected from the boundary surface of the inner gap G2-1 to achieve a high Q factor at the antiresonance point.

For example, a third capacitor portion is formed in an area in which the inner gap G2-1 is formed, and a fourth capacitor portion having a capacitance different from a capacitance of the third capacitor portion is formed outwardly of the inner gap G2-1. Accordingly, the high Q factor may be achieved in the antiresonance portion.

Figure 6:
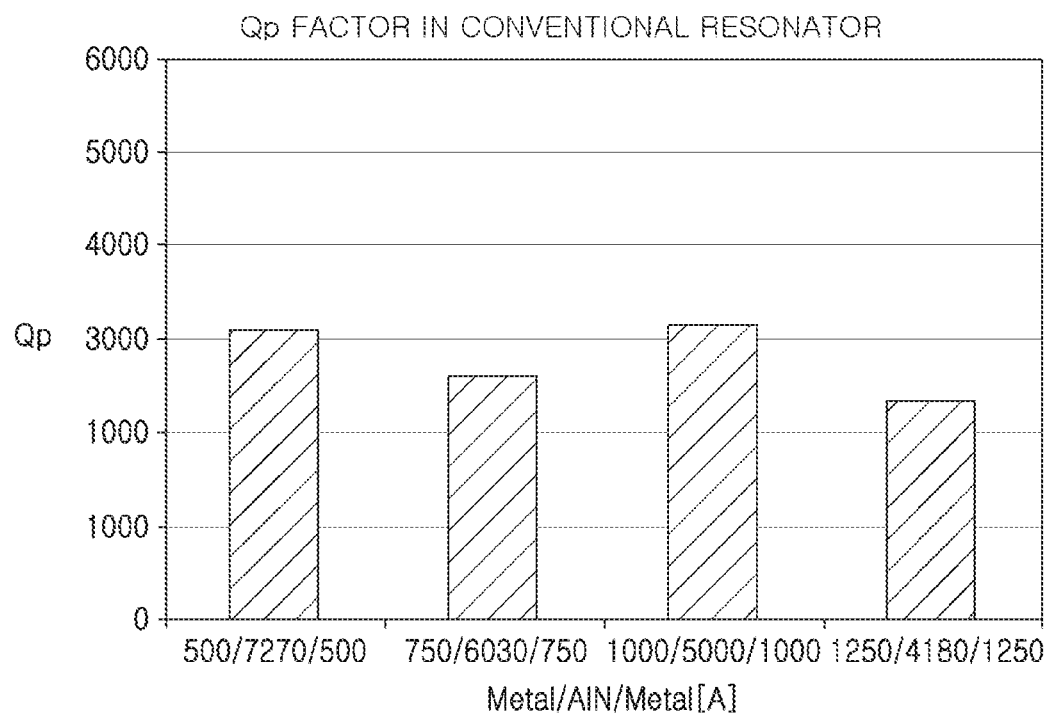
FIG. 6 is a graph depicting a Qp factor of a conventional resonator.
Figure 7:
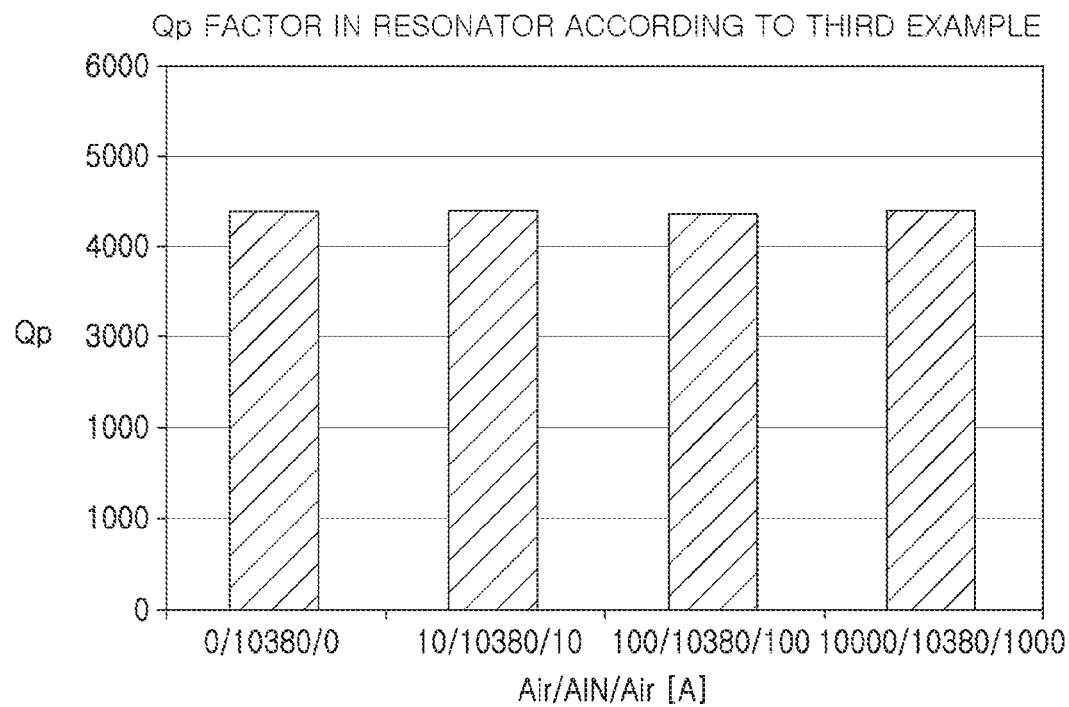
FIG. 7 is a graph depicting a Qp factor of the bulk acoustic wave resonator according to FIG. 5.

In the case of a conventional resonator, for example, in the case in which the first and second gaps G13 and G2 are not formed, Qp (phase quality factor) values are between 2327 and 3141, as shown in FIG. 6. However, in the case in which the first and second gaps G1 and G2 are formed, Qp values are between 3790 and 4201, a shown in FIG. 7.

Figure 8:
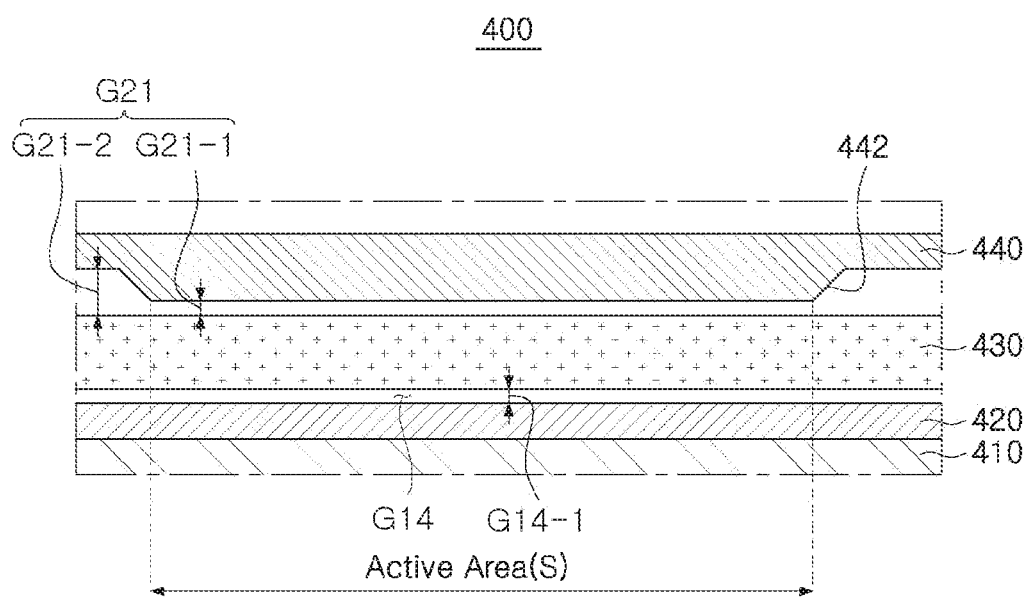
FIG. 8 is an explanatory view of a bulk acoustic wave resonator, according to an example.

FIG. 8 is an explanatory view of a bulk acoustic wave resonator 400, according an example.

Referring to FIG. 8, the bulk acoustic wave resonator 400 may include a first electrode 420 and a piezoelectric layer 430 that are spaced apart from each other in a portion to form a first gap G14. The piezoelectric layer 430 and a second electrode 440 are spaced apart from each other in a portion to form a second gap G21. That is, the first gap G14 is formed between a lower surface of the piezoelectric layer 430 and an upper surface of the first electrode 420, and the second gap G21 is disposed between an upper surface of the piezoelectric layer 430 and a lower surface of the second electrode 440. The first electrode 420 may be disposed on a substrate 410.

As mentioned above, the first electrode 420 and the piezoelectric layer 430 are spaced apart from each other in a portion to form the first gap G14. As an example, the first gap G14 may be formed by removing a sacrificial layer (not shown). As such, the first gap G14 may be provided to achieve a high Q factor. For example, the first gap G14 may act as a capacitor to achieve a high Q factor, even in a high frequency band.

When an inner gap G14-1 of the gap G14 is reduced to have high capacitance, signal loss may be reduced in a high frequency band. Thus, reflection efficiency of a vertical wave generated at a boundary between the piezoelectric layer 430 and the first gap G14 during resonance may be improved to achieve a high Q factor.

Since a frequency of the bulk acoustic wave resonator 400 is only affected by a thickness of the piezoelectric layer 430, a thickness of the first electrode 420 may increase in such a structure. Accordingly, resistance formed by the first electrode 420 may be reduced without being limited by a frequency. As a result, a high Q factor may be achieved at a resonance point.

A second electrode 440 and a piezoelectric layer 430 are spaced apart from each other in a portion to form the second gap G21. The second gap G21 may include an inner gap G21-1 disposed in an active area S and an outer gap G21-2 disposed outwardly of the active area S. To form the outer gap G21-2, an inclined surface 442 is formed on the second electrode 440. The inclined surface 442 may be included in the second electrode 440 such that the inclined surface 442 is disposed outwardly of the active area S.

The inner gap G21-1 may be provided to achieve a high Q factor. For example, the inner gap G21-1 may act as a capacitor to achieve a high Q factor even in a high frequency band.

When the inner gap G21-1 is reduced to have high capacitance, signal loss may be reduced in a high frequency band. Thus, reflection efficiency of a vertical wave generated at a boundary between the piezoelectric layer 430 and the inner gap G21-1 during resonance may be improved to achieve a high Q factor.

Since a frequency of the bulk acoustic wave resonator 400 is only affected by a thickness of the piezoelectric layer 430, a thickness of the second electrode 440 may increase in such a structure. Accordingly, resistance formed by the second electrode 440 may be reduced without being limited by a frequency. As a result, a high Q factor may be achieved at a resonance point.

Moreover, since the second gap G21 includes the outer gap G21-2, energy leakage caused by a lateral wave generated during resonance driving may be reduced. Accordingly, the lateral wave is reflected from a boundary surface causing a difference in an electric field applied to the piezoelectric layer 430 to achieve a high Q factor at an antiresonance point. For example, since a capacitance varies rapidly at a boundary surface of the inner gap G21-1, a lateral wave may be reflected from the boundary surface of the inner gap G21-1 to achieve a high Q factor at the antiresonance point.

For example, a first capacitor portion is formed in an area in which the inner gap G21-1 is formed, and a second capacitor portion having a capacitance different from a capacitance of the first capacitor portion is formed outwardly of the inner gap G21-1. Accordingly, the high Q factor may be achieved in the antiresonance portion.

Figure 9:
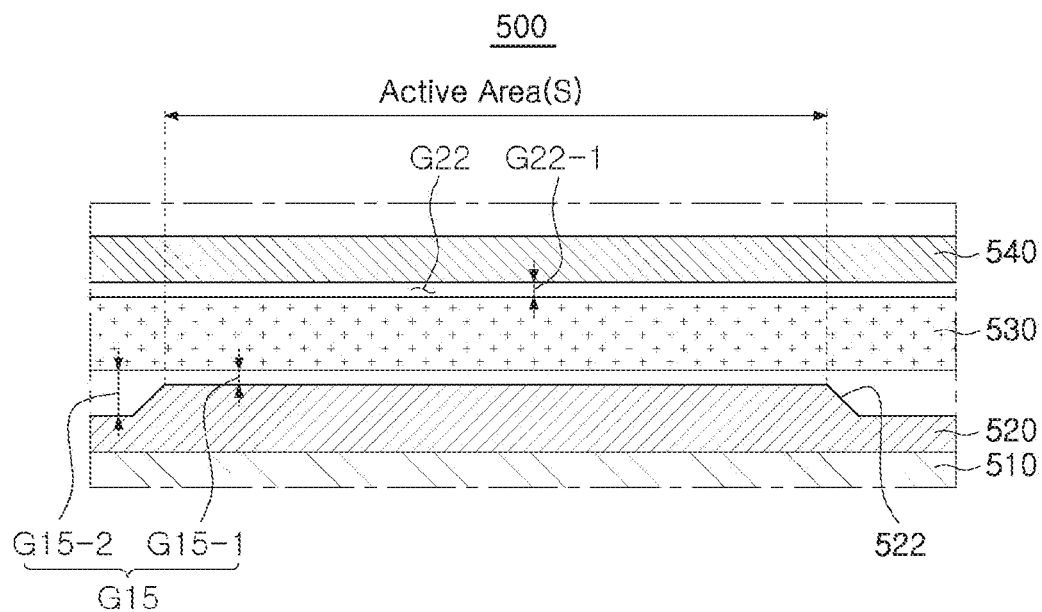
FIG. 9 is an explanatory view of a bulk acoustic wave resonator, according to an example.

FIG. 9 is an explanatory view of a bulk acoustic wave resonator 500, according to an example.

Referring to FIG. 9, the bulk acoustic wave resonator 500 may include a first electrode 520 and a piezoelectric layer 530 are spaced apart from each other in a portion to form a first gap G15. The piezoelectric layer 530 and a second electrode 540 are spaced apart from each other in a portion to form a second gap G22. That is, the first gap G15 is formed between a lower surface of the piezoelectric layer 530 and an upper surface of the first electrode 520, and the second gap G22 is disposed between an upper surface of the piezoelectric layer 530 and a lower surface of the second electrode 540. The first electrode 520 may be disposed on a substrate 510.

The first gap G15 may include an inner gap G15-1 disposed in the active area S and an outer gap G15-2 disposed outwardly of the active area S. To form the outer gap G15-2, an inclined surface 522 is formed on the first electrode 520. The inclined surface 522 may be included in the first electrode 520 such that the inclined surface 522 is disposed outwardly of the active area S.

The inner gap G15-1 may be provided to achieve a high Q factor. For example, the inner gap G15-1 may act as a capacitor to achieve a high Q factor even in a high frequency band.

When the inner gap G15-1 is reduced to have high capacitance, signal loss may be reduced in a high frequency band. Thus, reflection efficiency of a vertical wave generated at a boundary between the piezoelectric layer 530 and the inner gap G15-1 during resonance may be improved to achieve a high Q factor.

Since a frequency of the bulk acoustic wave resonator 500 is only affected by a thickness of the piezoelectric layer 530, a thickness of the first electrode 520 may increase in such a structure. Accordingly, resistance formed by the first electrode 520 may be reduced without being limited by a frequency. As a result, a high Q factor may be achieved at a resonance point.

Moreover, since the first gap G15 includes the outer gap G15-2, energy leakage caused by a lateral wave generated during resonance driving may be reduced. Accordingly, the lateral wave is reflected from a boundary surface causing a difference in an electric field applied to the piezoelectric layer 530 to achieve a high Q factor at an antiresonance point. For example, since a capacitance varies rapidly on a boundary surface of the inner gap G15-1, a lateral wave may be reflected to achieve a high Q factor at the antiresonance point.

For example, a first capacitor portion is formed in an area in which the inner gap G15-1 is formed, and a second capacitor portion having a capacitance different from a capacitance of the first capacitor portion is formed outwardly of the inner gap G15-1. Accordingly, the high Q factor may be achieved in the antiresonance portion.

The second electrode 540 and the piezoelectric layer 530 are spaced apart from each other in a portion to form a second gap G22. As an example, the second gap G22 may be formed by removing a sacrificial layer (not shown). As such, the second gap G22 may be provided to achieve a high Q factor. For example, the second gap G22 may act as a capacitor to achieve a high Q factor even in a high frequency band.

When an inner gap G22-1 is reduced to have high capacitance, signal loss may be reduced in a high frequency band. Thus, reflection efficiency of a vertical wave generated at a boundary between the piezoelectric layer 530 and the inner gap G22-1 during resonance may be improved to achieve a high Q factor.

Since a frequency of the bulk acoustic wave resonator 500 is only affected by a thickness of the piezoelectric layer 530, a thickness of the second electrode 540 may increase in such a structure. Accordingly, resistance formed by the second electrode 540 may be reduced without being limited by a frequency. As a result, a high Q factor may be achieved at a resonance point.

Figure 10:
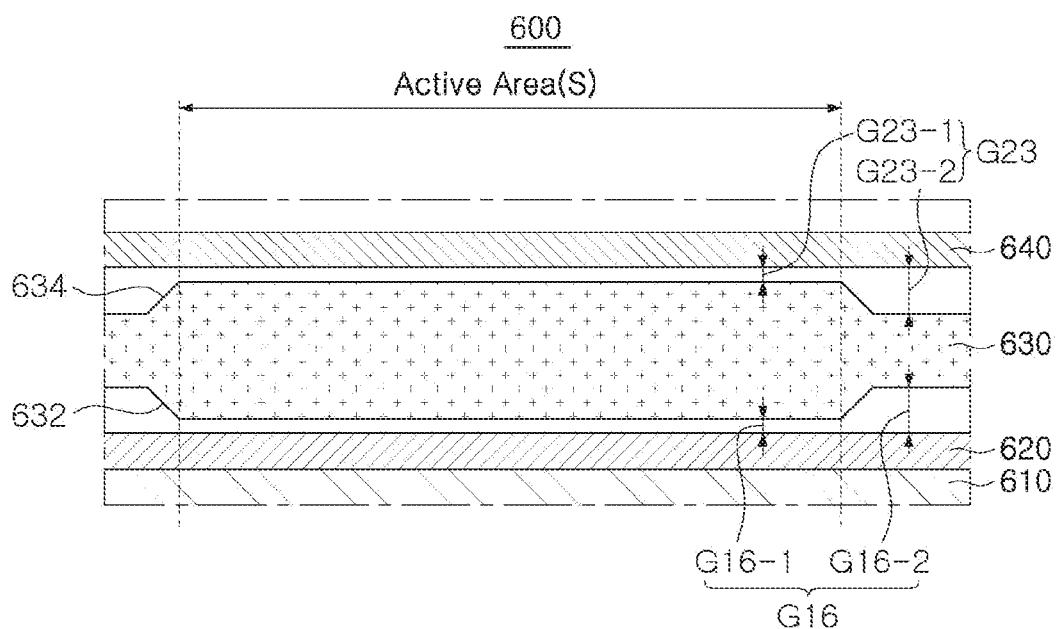
FIG. 10 is an explanatory view of a bulk acoustic wave resonator, according to an example.

FIG. 10 is an explanatory view of a bulk acoustic wave resonator 600, according to an example.

Referring to FIG. 10, the bulk acoustic wave resonator 600 includes a first electrode 620 and a piezoelectric layer 630 that are spaced apart from each other in a portion to form a first gap G16. The piezoelectric layer 630 and a second electrode 640 are spaced apart from each other in a portion to form a second gap G23. That is, the first gap G16 is formed between a lower surface of the piezoelectric layer 630 and an upper surface of the first electrode 620, and the second gap G23 is disposed between an upper surface of the piezoelectric layer 630 and a lower surface of the second electrode 640. The first electrode 620 may be disposed on a substrate 610.

The first gap G16 may include in inner gap G16-1 disposed in an active area S and an outer gap G16-2 disposed outwardly of the active area S. To form the outer gap G16-2, a first inclined surface 632 is formed on the piezoelectric layer 630. The first inclined surface 632 may be included in the piezoelectric layer 630 such that the first inclined surface 632 is disposed outwardly of the active area S.

The inner gap G16-1 may be provided to achieve a high Q factor. For example, the inner gap G16-1 may act as a capacitor to achieve a high Q factor even in a high frequency band.

When the inner gap G16-1 is reduced to have high capacitance, signal loss may be reduced in a high frequency band. Thus, reflection efficiency of a vertical wave generated at a boundary between the piezoelectric layer 630 and the inner gap G16-1 during resonance may be improved to achieve a high Q factor.

Since a frequency of the bulk acoustic wave resonator 600 is only affected by a thickness of the piezoelectric layer 630, a thickness of the first electrode 620 may increase in such a structure. Accordingly, resistance formed by the first electrode 620 may be reduced without being limited by a frequency. As a result, a high Q factor may be achieved at a resonance point.

Moreover, since the first gap G1 includes the outer gap G16-2, energy leakage caused by a lateral wave generated during resonance driving may be reduced. Accordingly, the lateral wave is reflected from a boundary surface causing a difference in an electric field applied to the piezoelectric layer 630 to achieve a high Q factor at an antiresonance point. For example, since a capacitance varies rapidly on a boundary surface of the inner gap G16-1, a lateral wave may be reflected to achieve a high Q factor at the antiresonance point.

For example, a first capacitor portion is formed in an area in which the inner gap G16-1 is formed, and a second capacitor portion having a capacitance different from a capacitance of the first capacitor portion is formed outwardly of the inner gap G16-1. Accordingly, the high Q factor may be achieved in the antiresonance portion.

The second electrode 640 and a piezoelectric layer 630 are spaced apart from each other in a portion to form the second gap G23. The second gap G23 may include an inner gap G23-1 disposed in the active area S and an outer gap G23-2 disposed outwardly of the active area S. To form the outer gap G23-2, a second inclined surface 634 is formed on an upper end of the piezoelectric layer 630. The second inclined surface 634 may be included in the piezoelectric layer 630 such that the second inclined surface 634 is disposed outwardly of the active area S.

The inner gap G23-1 may be provided to achieve a high Q factor. For example, the inner gap G23-1 may act as a capacitor to achieve a high Q factor even in a high frequency band.

When the inner gap G23-1 is reduced to have high capacitance, signal loss may be reduced in a high frequency band. Thus, reflection efficiency of a vertical wave generated at a boundary between the piezoelectric layer 630 and the inner gap G23-1 during resonance may be improved to achieve a high Q factor.

Since a frequency of the bulk acoustic wave resonator 600 is only affected by a thickness of the piezoelectric layer 630, a thickness of the second electrode 640 may increase in such a structure. Accordingly, resistance formed by the second electrode 640 may be reduced without being limited by a frequency. As a result, a high Q factor may be achieved at a resonance point.

Moreover, since the second gap G23 includes the outer gap G23-2, energy leakage caused by a lateral wave generated during resonance driving may be reduced. Accordingly, the lateral wave is reflected from a boundary surface causing a difference in an electric field applied to the piezoelectric layer 630 to achieve a high Q factor at an antiresonance point. For example, since a capacitance varies rapidly at a boundary surface of the inner gap G23-1, a lateral wave may be reflected from the boundary surface of the inner gap G23-1 to achieve a high Q factor at the antiresonance point.

For example, a third capacitor portion is formed in an area in which the inner gap G23-1 is formed, and a fourth capacitor portion having a capacitance different from a capacitance of the third capacitor portion is formed outwardly of the inner gap G23-1. Accordingly, the high Q factor may be achieved in the antiresonance portion.

Figure 11:
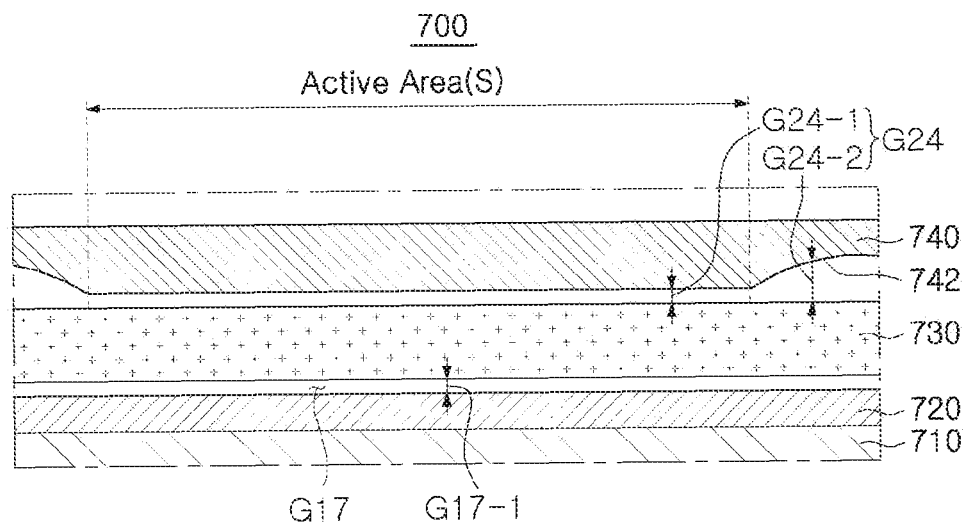
FIG. 11 is an explanatory view of a bulk acoustic wave resonator, according to an example.

FIG. 11 is an explanatory view of a bulk acoustic wave resonator 700, according to an example.

Referring to FIG. 11, the bulk acoustic wave resonator 700 includes a first electrode 720 and a piezoelectric layer 730 are spaced apart from each other in a portion to form a first gap G17. The piezoelectric layer 730 and a second electrode 740 are spaced apart from each other in a portion to form a second gap G24. That is, the first gap G17 is formed between a lower surface of the piezoelectric layer 730 and an upper surface of the first electrode 720, and the second gap G24 is disposed between an upper surface of the piezoelectric layer 730 and a lower surface of the second electrode 740. The first electrode 720 may be disposed on a substrate 710.

The first electrode 720 and the piezoelectric layer 730 are spaced apart from each other in a portion to form the first gap G17. As an example, the first gap G17 may be formed by removing a sacrificial layer (not shown). The first gap G17 may be provided to achieve a high Q factor. For example, the first gap G17 may act as a capacitor to achieve a high Q factor even in a high frequency band.

When the first gap G17 is reduced to have high capacitance, signal loss may be reduced in a high frequency band. Thus, reflection efficiency of a vertical wave generated at a boundary between the piezoelectric layer 730 and the first gap G17 during resonance may be improved to achieve a high Q factor.

Since a frequency of the bulk acoustic wave resonator 700 is only affected by a thickness of the piezoelectric layer 730, a thickness of the second electrode 740 may increase in such a structure. Accordingly, resistance formed by the first electrode 720 may be reduced without being limited by a frequency. As a result, a high Q factor may be achieved at a resonance point.

The second electrode 740 and the piezoelectric layer 730 are spaced apart from each other in a portion to form the second gap G24. The second gap G24 may include an inner gap G24-1 disposed in an active area S and an outer gap G24-2 disposed outwardly of the active area S. To form the outer gap G24-2, an inclined surface 742 is formed on the second electrode 740. The inclined surface 742 may be included in the second electrode 740 such that the inclined surface 742 is disposed outwardly of the active area S.

The inner gap G24-1 may be provided to achieve a high Q factor. For example, the inner gap G24-1 may act as a capacitor to achieve a high Q factor even in a high frequency band.

When the inner gap G24-1 is reduced to have high capacitance, signal loss may be reduced in a high frequency band. Thus, reflection efficiency of a vertical wave generated at a boundary between the piezoelectric layer 730 and the inner gap G24-1 during resonance may be improved to achieve a high Q factor.

Since a frequency of the bulk acoustic wave resonator 700 is only affected by a thickness of the piezoelectric layer 730, a thickness of the second electrode 740 may increase in such a structure. Accordingly, resistance formed by the second electrode 740 may be reduced without being limited by a frequency. As a result, a high Q factor may be achieved at a resonance point.

Moreover, since the second gap G24 includes the outer gap G24-2, energy leakage caused by a lateral wave generated during resonance driving may be reduced. Accordingly, the lateral wave is reflected from a boundary surface causing a difference in an electric field applied to the piezoelectric layer 730 to achieve a high Q factor at an antiresonance point. For example, since a capacitance varies rapidly at a boundary surface of the inner gap G24-1, a lateral wave may be reflected from the boundary surface of the inner gap G24-1 to achieve a high Q factor at the antiresonance point.

For example, a first capacitor portion is formed in an area in which an inner gap G17-1 is formed, and a second capacitor portion having a capacitance different from a capacitance of the first capacitor portion is formed outwardly of the inner gap G17-1. Accordingly, the high Q factor may be achieved in the antiresonance portion.

Figure 12:
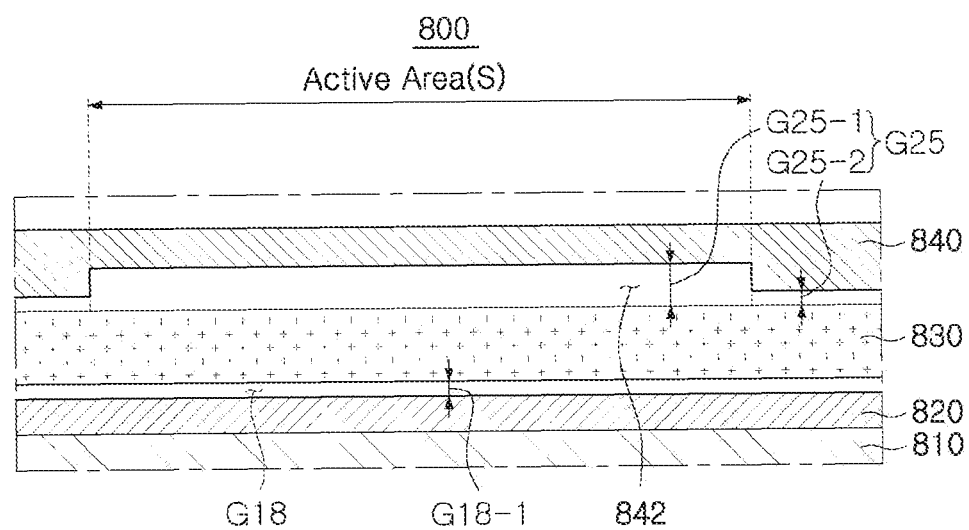
FIG. 12 is an explanatory view of a bulk acoustic wave resonator, according to an example.

FIG. 12 is an explanatory view of a bulk acoustic wave resonator 800, according to an example.

Referring to FIG. 12, the bulk acoustic wave resonator 800 includes a first electrode 820 and a piezoelectric layer 830 that are spaced apart from each other in a portion to form a first gap G18. The piezoelectric layer 830 and a second electrode 840 are spaced apart from each other in a portion to form a second gap G25. That is, the first gap G18 is formed between a lower surface of the piezoelectric layer 830 and an upper surface of the first electrode 820, and the second gap G25 is disposed between an upper surface of the piezoelectric layer 830 and a lower surface of the second electrode 840. The first electrode 820 may be disposed on a substrate 810.

The first electrode 820 and the piezoelectric layer 830 are spaced apart from each other in a portion to form the first gap G18. As an example, the first gap G18 may be formed by removing a sacrificial layer (not shown). The first gap G18 may be provided to achieve a high Q factor. For example, the first gap G18 may act as a capacitor to achieve a high Q factor even in a high frequency band.

When the first gap G18 is reduced to have high capacitance, signal loss may be reduced in a high frequency band. Thus, reflection efficiency of a vertical wave generated at a boundary between the piezoelectric layer 830 and the first gap G18 during resonance may be improved to achieve a high Q factor.

Since a frequency of the bulk acoustic wave resonator 800 is only affected by a thickness of the piezoelectric layer 830, a thickness of the first electrode 820 may increase in such a structure. Accordingly, resistance formed by the first electrode 820 may be reduced without being limited by a frequency. As a result, a high Q factor may be achieved at a resonance point.

The second gap G25 is disposed between the second electrode 840 and the piezoelectric layer 830. The second gap G2 may include an inner gap G25-1 disposed in an active area S and an outer gap G25-2 disposed outwardly of the active area S. To form the outer gap G25-2, a step groove 842 is formed on the second electrode 840. The step groove 842 may be formed on the second electrode 840 such that the step groove 842 is disposed in the active region S.

Since the second gap G25 includes an inner gap G25-1 and an outer gap G25-2, energy leakage caused by a lateral wave generated during resonance driving may be reduced. Accordingly, the lateral wave is reflected from a boundary surface causing a difference in an electric field applied to the piezoelectric layer 830 to achieve a high Q factor at an antiresonance point. For example, since a capacitance varies rapidly on a boundary surface of an inner gap G18-1, a lateral wave may be reflected to achieve a high Q factor at the antiresonance point. For example, since a capacitance varies rapidly on a boundary surface of the inner gap G25-1, the lateral wave may be reflected to achieve a high Q factor at the antiresonance point.

For example, a first capacitor portion is formed in an area in which the inner gap G25-1 is formed, and a second capacitor portion having a capacitance different from a capacitance of the first capacitor portion is formed outwardly of the inner gap G25-1. Accordingly, the high Q factor may be achieved in the antiresonance portion.

Figure 13:
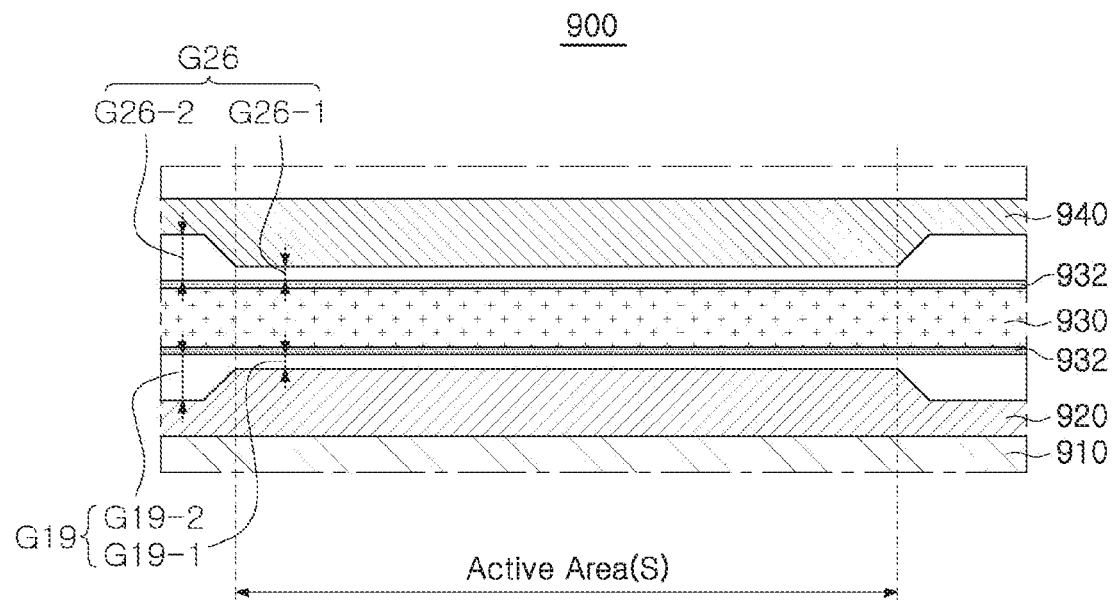
FIG. 13 is an explanatory view of a bulk acoustic wave resonator, according to an example.

FIG. 13 is an explanatory view of a bulk acoustic wave resonator 900, according to an example.

Referring to FIG. 13, the bulk acoustic wave resonator 900 includes a first electrode 920 and a piezoelectric layer 930 that are spaced apart from each other in a portion to form a first gap G19. The piezoelectric layer 930 and a second electrode 940 are spaced apart from each other in a portion to form a second gap G26. That is, the first gap G19 is formed between a lower surface of the piezoelectric layer 930 and an upper surface of the first electrode 920, and the second gap G26 is disposed between an upper surface of the piezoelectric layer 930 and a lower surface of the second electrode 940. The first electrode 920 may be disposed on a substrate 910.

The first gap G19 may include an inner gap G19-1 disposed in an active area S and an outer gap G19-2 disposed outwardly of the active area S. To form the outer gap G19-2, an inclined surface 922 is formed on the first electrode 920. The inclined surface 922 may be included in the first electrode 920 such that the inclined surface 922 is disposed outwardly of the active area S.

The inner gap G19-1 may be provided to achieve a high Q factor. For example, the inner gap G19-1 may act as a capacitor to achieve a high Q factor even in a high frequency band.

When the inner gap G19-1 is reduced to have high capacitance, signal loss may be reduced in a high frequency band. Thus, reflection efficiency of a vertical wave generated at a boundary between the piezoelectric layer 930 and the inner gap G19-1 during resonance may be improved to achieve a high Q factor.

Since a frequency of the bulk acoustic wave resonator 900 is only affected by a thickness of the piezoelectric layer 930, a thickness of the first electrode 920 may increase in such a structure. Accordingly, resistance formed by the first electrode 920 may be reduced without being limited by a frequency. As a result, a high Q factor may be achieved at a resonance point.

Moreover, since the first gap G1 includes the outer gap G19-2, energy leakage caused by a lateral wave generated during resonance driving may be reduced. Accordingly, the lateral wave is reflected from a boundary surface causing a difference in an electric field applied to the piezoelectric layer 930 to achieve a high Q factor at an antiresonance point. For example, since a capacitance varies rapidly on a boundary surface of the inner gap G19-1, a lateral wave may be reflected to achieve a high Q factor at the antiresonance point.

For example, a first capacitor portion is formed in an area in which the inner gap G19-1 is formed, and a second capacitor portion having a capacitance different from a capacitance of the first capacitor portion is formed outwardly of the inner gap G19-1. Accordingly, the high Q factor may be achieved in the antiresonance portion.

The piezoelectric layer 930 is disposed above at least a portion of the first electrode 920. The piezoelectric layer 930 is configured to convert electrical energy into mechanical energy in the form of an acoustic wave, a piezoelectric effect. As an example, the piezoelectric layer 930 is formed of one of aluminum nitride (AlN), zinc oxide (ZnO), and lead zirconate titanate (PbZrTiO (PZT)). The piezoelectric layer 930 may further include a rare earth metal. As an example, the piezoelectric layer 930 may include at least one of scandium (Sc), erbium (Er), yttrium (Y), and lanthanum (La). The piezoelectric layer 930 may include a transition metal. As an example, the transition metal may include any one or any combination of any two or more of zirconium (Zr), hafnium (Hf), tantalum (Ta), and niobium (Nb). Also the piezoelectric layer 930 may include magnesium (Mg), or another divalent metal.

The piezoelectric layer 930 may be provided with surface treatment layers 932 and 934. The surface treatment layers 932 and 934 may be disposed on a top surface and a bottom surface of the piezoelectric layer 930, respectively. As an example, the surface treatment layers 932 and 934 may be formed through doping or annealing. Alternatively, the surface treatment layers 932 and 934 may be formed by a stress variation process performed while changing a deposition condition (for example, temperature or RF power adjustment) of the piezoelectric layer 930.

Since the surface treatment layers 932 and 934 are respectively disposed on the top and bottom surfaces of the piezoelectric layer 930, a quality of a resonator (for example, Kt2) may be improved, compared with a case in which the piezoelectric layer 930 is exposed to an air layer.

The second gap G26 is disposed between the second electrode 940 and the piezoelectric layer 930. The second gap G26 may include an inner gap G26-1 disposed in the active area S and an outer gap G26-2 disposed outwardly of the active area S. To form the outer gap G26-2, an inclined surface 942 is formed on the second electrode 940. The inclined surface 942 may be included in the second electrode 940 such that the inclined surface 942 is disposed outwardly of the active area S.

The inner gap G26-1 may be provided to achieve a high Q factor. For example, the inner gap G26-1 may act as a capacitor to achieve a high Q factor even in a high frequency band.

When the inner gap G26-1 is reduced to have high capacitance, signal loss may be reduced in a high frequency band. Thus, reflection efficiency of a vertical wave generated at a boundary between the piezoelectric layer 930 and the inner gap G26-1 during resonance may be improved to achieve a high Q factor.

Since a frequency of the bulk acoustic wave resonator 900 is only affected by a thickness of the piezoelectric layer 930, a thickness of the second electrode 940 may increase in such a structure. Accordingly, resistance formed by the second electrode 940 may be reduced without being limited by a frequency. As a result, a high Q factor may be achieved at a resonance point.

Moreover, since the second gap G26 includes the outer gap G26-2, energy leakage caused by a lateral wave generated during resonance driving may be reduced. Accordingly, the lateral wave is reflected from a boundary surface causing a difference in an electric field applied to the piezoelectric layer 930 to achieve a high Q factor at an antiresonance point. For example, since a capacitance varies rapidly at a boundary surface of the inner gap G26-1, a lateral wave may be reflected from the boundary surface of the inner gap G26-1 to achieve a high Q factor at the antiresonance point.

For example, a third capacitor portion is formed in an area in which the inner gap G26-1 is formed, and a fourth capacitor portion having a capacitance different from a capacitance of the third capacitor portion is formed outwardly of the inner gap G26-1. Accordingly, the high Q factor may be achieved in the antiresonance portion.

Figure 14:
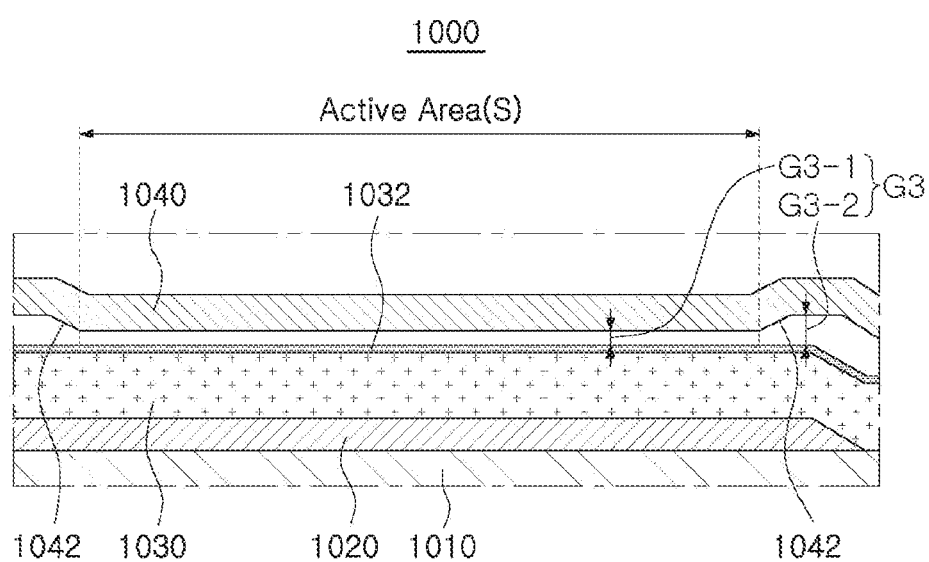
FIG. 14 is an explanatory view of a bulk acoustic wave resonator, according to an example.

FIG. 14 is an explanatory view of a bulk acoustic wave resonator 1000, according to an example.

Referring to FIG. 14, the bulk acoustic wave resonator 1000 includes a first electrode 1020 disposed on a substrate 1010, and a piezoelectric layer 1030 disposed on the first electrode 1020. A second electrode 1040 is disposed above the piezoelectric layer 1030, and the second electrode 1040 and the piezoelectric layer 1030 are spaced apart from each other in a portion to form a first gap G3.

The piezoelectric layer 1030 is configured to convert electrical energy into mechanical energy in the form of an acoustic wave, a piezoelectric effect. As an example, the piezoelectric layer 1130 may be formed of one of aluminum nitride (AlN), zinc oxide (ZnO), and lead zirconate titanate (PbZrTiO (PZT)). The piezoelectric layer 1030 may further include a rare earth metal. As an example, the piezoelectric layer 1030 may include any one or any combination of any two or more of scandium (Sc), erbium (Er), yttrium (Y), and lanthanum (La). The piezoelectric layer 1030 may include a transition metal. As an example, the transition metal may include any one or any combination of any two or more of zirconium (Zr), hafnium (Hf), tantalum (Ta), and niobium (Nb). Also the piezoelectric layer 1030 may include a divalent metal such as magnesium (Mg).

The piezoelectric layer 1030 may be provided with a surface treatment layer 1032. The surface treatment layer 1032 may be disposed on a top surface of the piezoelectric layer 1030. As an example, the surface treatment layer 1032 may be formed through doping or annealing. Alternatively, the surface treatment layer 1032 may be formed by a stress variation process performed while changing a deposition condition (for example, temperature or RF power adjustment) of the piezoelectric layer 1030.

Since the surface treatment layer 1032 is disposed on the top surface of the piezoelectric layer 1030, a quality of a resonator (for example, Kt2) may be improved, compared with a case in which the piezoelectric layer 1030 is exposed to an air layer.

The first gap G3 is disposed between the second electrode 1040 and the piezoelectric layer 1030. The first gap G3 may include an inner gap G3-1 disposed in an active area S and an outer gap G3-2 disposed outwardly of the active area S. To form the outer gap G3-2, an inclined surface 1042 is formed on the second electrode 1040. The inclined surface 1042 may be included in the second electrode 1040 such that the inclined surface 1042 is disposed outwardly of the active area S.

The inner gap G3-1 may be provided to achieve a high Q factor. For example, the inner gap G3-1 may act as a capacitor to achieve a high Q factor even in a high frequency band.

When the inner gap G3-1 is reduced to have high capacitance, signal loss may be reduced in a high frequency band. Thus, reflection efficiency of a vertical wave generated at a boundary between the piezoelectric layer 1030 and the inner gap G3-1 during resonance may be improved to achieve a high Q factor.

Since a frequency of the bulk acoustic wave resonator 1000 is only affected by a thickness of the piezoelectric layer 1030, a thickness of the second electrode 1040 may increase in such a structure. Accordingly, resistance formed by the second electrode 1040 may be reduced without being limited by a frequency. As a result, a high Q factor may be achieved at a resonance point.

Moreover, since the first gap G3 includes the outer gap G3-2, energy leakage caused by a lateral wave generated during resonance driving may be reduced. Accordingly, the lateral wave is reflected from a boundary surface causing a difference in an electric field applied to the piezoelectric layer 1030 to achieve a high Q factor at an antiresonance point. For example, since a capacitance varies rapidly on a boundary surface of the inner gap G3-1, a lateral wave may be reflected to achieve a high Q factor at the antiresonance point.

For example, a first capacitor portion is formed in an area in which the inner gap G3-1 is formed, and a second capacitor portion having a capacitance different from a capacitance of the first capacitor portion is formed outwardly of the inner gap G3-1. Accordingly, the high Q factor may be achieved in the antiresonance portion.

Figure 15:
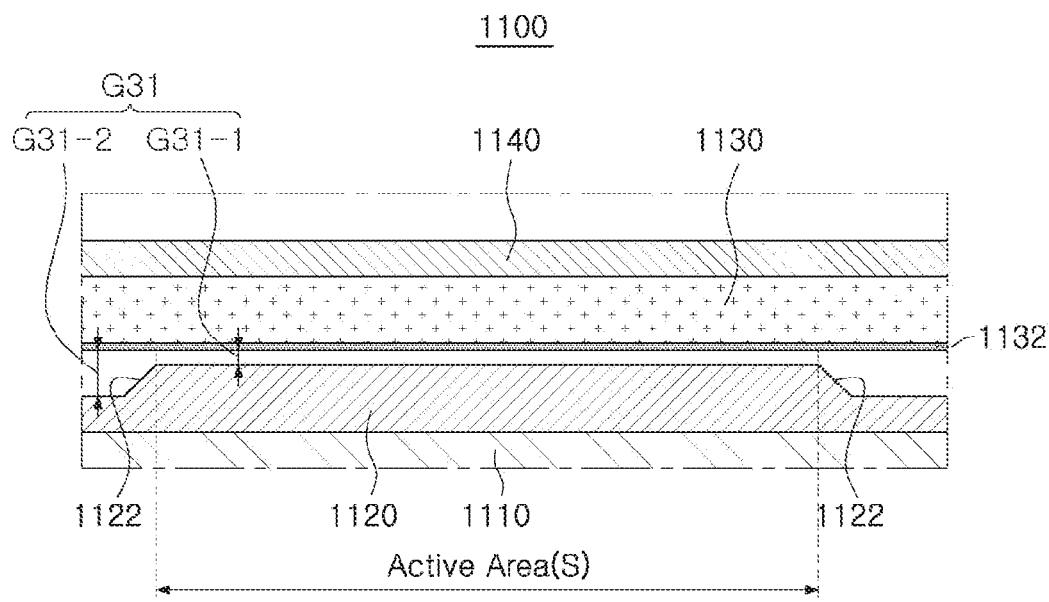
FIG. 15 is an explanatory view of a bulk acoustic wave resonator, according to an example.

FIG. 15 is an explanatory view of a bulk acoustic wave resonator 1100, according to an example.

Referring to FIG. 15, the bulk acoustic wave resonator 1100 includes a first electrode 1120 and a piezoelectric layer 1130 are spaced apart from each other in a portion to form a first gap G31. The first electrode 1120 may be disposed on a substrate 1110. A second electrode 1140 may be disposed on the piezoelectric layer 1130.

The first gap G31 may include an inner gap G31-1 disposed in an active area S and an outer gap G31-2 disposed outwardly of the active area S. To form the outer gap G31-2, an inclined surface 1122 is formed on the first electrode 1120. The inclined surface 1122 may be included in the first electrode 1120 such that the inclined surface 1122 is disposed outwardly of the active area S.

The inner gap G31-1 may be provided to achieve a high Q factor. For example, the inner gap G31-1 may act as a capacitor to achieve a high Q factor even in a high frequency band.

When the inner gap G31-1 is reduced to have high capacitance, signal loss may be reduced in a high frequency band. Thus, reflection efficiency of a vertical wave generated at a boundary between the piezoelectric layer 1130 and the inner gap G31-1 during resonance may be improved to achieve a high Q factor.

Since a frequency of the bulk acoustic wave resonator 1100 is only affected by a thickness of the piezoelectric layer 1130, a thickness of the first electrode 1120 may increase in such a structure. Accordingly, resistance formed by the first electrode 1120 may be reduced without being limited by a frequency. As a result, a high Q factor may be achieved at a resonance point.

Moreover, since the first gap G31 includes the outer gap G31-2, energy leakage caused by a lateral wave generated during resonance driving may be reduced. Accordingly, the lateral wave is reflected from a boundary surface causing a difference in an electric field applied to the piezoelectric layer 1130 to achieve a high Q factor at an antiresonance point. For example, since a capacitance varies rapidly on a boundary surface of the inner gap G31-1, a lateral wave may be reflected to achieve a high Q factor at the antiresonance point.

For example, a first capacitor portion is formed in an area in which the inner gap G31-1 is formed, and a second capacitor portion having a capacitance different from a capacitance of the first capacitor portion is formed outwardly of the inner gap G31-1. Accordingly, the high Q factor may be achieved in the antiresonance portion.

The piezoelectric layer 1130 is disposed on at least a portion of the first electrode 1120. The piezoelectric layer 1130 is configured to convert electrical energy into mechanical energy in the form of an acoustic wave. As an example, the piezoelectric layer 1130 is formed of one of aluminum nitride (AlN), zinc oxide (ZnO), and lead zirconate titanate (PbZrTiO (PZT)). The piezoelectric layer 130 may further include a rare earth metal. As an example, the piezoelectric layer 1130 may include any one or any combination of any two or more of scandium (Sc), erbium (Er), yttrium (Y), and lanthanum (La). The piezoelectric layer 130 may include a transition metal. As an example, the transition metal may include any one or any combination of any two or more of zirconium (Zr), hafnium (Hf), tantalum (Ta), and niobium (Nb). Also the piezoelectric layer 130 may include a divalent metal such as magnesium (Mg).

The piezoelectric layer 1130 may be provided with a surface treatment layer 1132. The surface treatment layer 1132 may be disposed on a bottom surface of the piezoelectric layer 1130. As an example, the surface treatment layers 1132 may be formed through doping or annealing. Alternatively, the surface treatment layer 1132 may be formed by a stress variation process performed while changing a deposition condition (for example, temperature or RF power adjustment) of the piezoelectric layer 1130.

Since the surface treatment layer 1132 is disposed on the bottom surface of the piezoelectric layer 1130, a quality of a resonator (for example, Kt2) may be improved, compared with a case in which the piezoelectric layer 1130 is exposed to an air layer.

Figure 16:
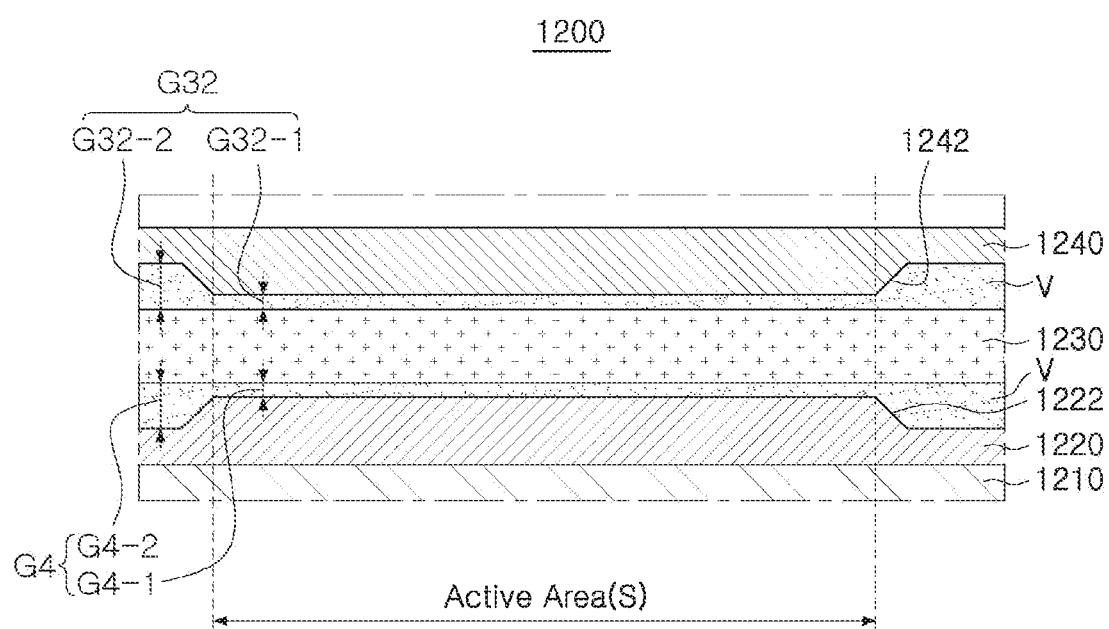
FIG. 16 is an explanatory view of a bulk acoustic wave resonator, according to an example.

FIG. 16 is an explanatory view of a bulk acoustic wave resonator 1200, according to an example.

Referring to FIG. 16, the bulk acoustic wave resonator 1200 includes a first electrode 1220 and a piezoelectric layer 1230 are spaced apart from each other in a portion to form a first gap G32. The piezoelectric layer 1230 and a second electrode 1240 are spaced apart from each other in a portion to form a second gap G4. That is, the first gap G32 is formed between a lower surface of the piezoelectric layer 1230 and an upper surface of the first electrode 1220, and the second gap G4 is disposed between an upper surface of the piezoelectric layer 1230 and a lower surface of the second electrode 1240. The first electrode 1220 may be disposed on a substrate 1210.

The first gap G32 may include an inner gap G32-1 disposed in an active area S and an outer gap G32-2 disposed outwardly of the active area S. To form the outer gap G32-2, an inclined surface 1222 is formed on the first electrode 320. The inclined surface 1222 may be included in the first electrode 1220 such that the inclined surface 1222 is disposed outwardly of the active area S.

The inner gap G32-1 may be provided to achieve a high Q factor. For example, the inner gap G32-1 may act as a capacitor to achieve a high Q factor even in a high frequency band.

When the inner gap G32-1 is reduced to have high capacitance, signal loss may be reduced in a high frequency band. Thus, reflection efficiency of a vertical wave generated at a boundary between the piezoelectric layer 1230 and the inner gap G32-1 during resonance may be improved to achieve a high Q factor.

Since a frequency of the bulk acoustic wave resonator 1200 is only affected by a thickness of the piezoelectric layer 1230, a thickness of the first electrode 1220 may increase in such a structure. Accordingly, resistance formed by the first electrode 1220 may be reduced without being limited by a frequency. As a result, a high Q factor may be achieved at a resonance point.

Moreover, since the first gap G32 includes the outer gap G32-2, energy leakage caused by a lateral wave generated during resonance driving may be reduced. Accordingly, the lateral wave is reflected from a boundary surface causing a difference in an electric field applied to the piezoelectric layer 1230 to achieve a high Q factor at an antiresonance point. For example, since a capacitance varies rapidly on a boundary surface of the inner gap G32-1, a lateral wave may be reflected to achieve a high Q factor at the antiresonance point.

For example, a first capacitor portion is formed in an area in which the 1-inner gap G32-1 is formed, and a second capacitor portion having a capacitance different from a capacitance of the first capacitor portion is formed outwardly of the inner gap G32-1. Accordingly, the high Q factor may be achieved in the antiresonance portion.

The second electrode 1240 and the piezoelectric layer 1230 are spaced apart from each other in a portion to form a second gap G4. The second gap G4 may include an inner gap G4-1 disposed in the active area S and an outer gap G4-2 disposed outwardly of the active area S. To form the outer gap G4-2, an inclined surface 1242 is formed on the second electrode 1240. The inclined surface 1242 may be included in the second electrode 1240 to be disposed outwardly of the active area S.

The inner gap G4-1 may be provided to achieve a high Q factor. For example, the inner gap G4-1 may act as a capacitor to achieve a high Q factor even in a high frequency band.

When the inner gap G4-1 is reduced to have high capacitance, signal loss may be reduced in a high frequency band. Thus, reflection efficiency of a vertical wave generated at a boundary between the piezoelectric layer 1230 and the inner gap G4-1 during resonance may be improved to achieve a high Q factor.

Since a frequency of the bulk acoustic wave resonator 1200 is only affected by a thickness of the piezoelectric layer 1230, a thickness of the second electrode 1240 may increase in such a structure. Accordingly, resistance formed by the second electrode 1240 may be reduced without being limited by a frequency. As a result, a high Q factor may be achieved at a resonance point.

Moreover, since the second gap G2 includes the outer gap G4-2, energy leakage caused by a lateral wave generated during resonance driving may be reduced. Accordingly, the lateral wave is reflected from a boundary surface causing a difference in an electric field applied to the piezoelectric layer 1230 to achieve a high Q factor at an antiresonance point. For example, since a capacitance varies rapidly at a boundary surface of the inner gap G4-1, a lateral wave may be reflected from the boundary surface of the inner gap G4-1 to achieve a high Q factor at the antiresonance point.

For example, a third capacitor portion is formed in an area in which the inner gap G4-1 is formed, and a fourth capacitor portion having a capacitance different from a capacitance of the third capacitor portion is formed outwardly of the inner gap G4-1. Accordingly, the high Q factor may be achieved in the antiresonance portion.

The first gap G32 and the second gap G4 may be filled with a vapor V having a dielectric constant higher than a dielectric constant of air. For this reason, high capacitance may be obtained while avoiding a manufacturing process difficulty that may occur when a narrow gap (100 Å or less) is provided. For example, since the first and second gaps G32 and G4 are filled with a vapor having a dielectric constant higher than a dielectric constant of air, there is no need to provide a narrow gap. As a result, the occurrence of a manufacturing process difficulty associated with forming a narrow gap may be avoided.

As described above, a bulk acoustic wave resonator is configured such that a lateral wave may be reflected to achieve a high Q factor in an antiresonance point.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator, comprising:
a substrate;
a first electrode disposed over the substrate;
a piezoelectric layer disposed over at least a portion of the first electrode such that the first electrode and the piezoelectric layer are spaced apart from each other by a constant distance; and
a second electrode disposed over at least a portion of the piezoelectric layer,
wherein a first gap is disposed between the piezoelectric layer and the second electrode, and
wherein the first gap comprises:
a first inner gap disposed in an active area of the bulk acoustic wave resonator, and having a first spacing distance between the piezoelectric layer and the one of the first and second electrodes, and
a first outer gap disposed outwardly of the active area and having a second spacing distance, greater than the first spacing distance, between the piezoelectric layer and the one of the first and second electrodes.

2. The bulk acoustic wave resonator of claim 1, wherein the one of the first and second electrodes comprises an inclined surface that forms the first outer gap.

3. The bulk acoustic wave resonator of claim 1, wherein the one of the first and second electrodes has a curved surface that forms the first outer gap.

4. The bulk acoustic wave resonator of claim 1, further comprising a surface treatment layer disposed on the piezoelectric layer.

5. The bulk acoustic wave resonator of claim 1, wherein the first gap is filled with a gas having a dielectric constant higher than a dielectric constant of air.

6. The bulk acoustic wave resonator of claim 1, further comprising:
a spacer disposed between the piezoelectric layer and the one of the first and second electrodes.

7. The bulk acoustic wave resonator of claim 1, wherein the piezoelectric layer and the second electrode form a first capacitor portion having a first capacitance in the first inner gap, and
the piezoelectric layer and the second electrode form a second capacitor portion having a second capacitance different from the first capacitance peripheral to the first inner gap.

8. A bulk acoustic wave resonator, comprising:
a substrate;
a first electrode disposed over the substrate;
a piezoelectric layer disposed over at least a portion of the first electrode; and
a second electrode disposed over at least a portion of the piezoelectric layer such that the second electrode and the piezoelectric layer are spaced apart from each other by a constant distance,
wherein a first gap is disposed between the piezoelectric layer and the first electrode, and
wherein the first gap comprises:
a first inner gap disposed in an active area of the bulk acoustic wave resonator, and having a first spacing distance between the piezoelectric layer and the one of the first and second electrodes, and
a first outer gap disposed outwardly of the active area and having a second spacing distance, greater than the first spacing distance, between the piezoelectric layer and the one of the first and second electrodes.

9. The bulk acoustic wave resonator of claim 8, wherein the piezoelectric layer and the first electrode form a first capacitor portion having a first capacitance in the first inner gap, and
the piezoelectric layer and the first electrode form a second capacitor portion having a second capacitance different from the first capacitance peripheral to the first inner gap.

10. A bulk acoustic wave resonator, comprising:
a substrate;
a first electrode disposed over the substrate;
a piezoelectric layer disposed over at least a portion of the first electrode; and
a second electrode disposed over at least a portion of the piezoelectric layer,
wherein a first gap is disposed between the piezoelectric layer and one of the first and second electrodes,
wherein the first gap comprises:
a first inner gap disposed in an active area of the bulk acoustic wave resonator, and having a first spacing distance between the piezoelectric layer and the one of the first and second electrodes; and
a first outer gap disposed outwardly of the active area and having a second spacing distance, different than the first spacing distance, between the piezoelectric layer and the one of the first and second electrodes, and
wherein the piezoelectric layer comprises an inclined surface that forms the first outer gap.

11. The bulk acoustic wave resonator of claim 10, wherein the piezoelectric layer and the one of the first and second electrodes form a first capacitor portion having a first capacitance in the first inner gap, and
the piezoelectric layer and the one of the first and second electrodes form a second capacitor portion having a second capacitance different from the first capacitance peripheral to the first inner gap.

12. A bulk acoustic wave resonator, comprising:
a substrate;
a first electrode disposed over the substrate;
a piezoelectric layer disposed over at least a portion of the first electrode; and
a second electrode disposed over at least a portion of the piezoelectric layer,
wherein a first gap is disposed between the piezoelectric layer and one of the first and second electrodes,
wherein the first gap comprises:
a first inner gap disposed in an active area of the bulk acoustic wave resonator, and having a first spacing distance between the piezoelectric layer and the one of the first and second electrodes; and
a first outer gap disposed outwardly of the active area and having a second spacing distance, less than the first spacing distance, between the piezoelectric layer and the one of the first and second electrodes.

13. The bulk acoustic wave resonator of claim 12, wherein the piezoelectric layer and the one of the first and second electrodes form a first capacitor portion having a first capacitance in the first inner gap, and
the piezoelectric layer and the one of the first and second electrodes form a second capacitor portion having a second capacitance different from the first capacitance peripheral to the first inner gap.

14. A bulk acoustic wave resonator, comprising:
a substrate;
a first electrode disposed over the substrate;
a piezoelectric layer disposed over at least a portion of the first electrode; and
a second electrode disposed over at least a portion of the piezoelectric layer,
wherein a first gap is disposed between the piezoelectric layer and one of the first and second electrodes,
wherein the first gap comprises:
  a first inner gap disposed in an active area of the bulk acoustic wave resonator, and having a first spacing distance between the piezoelectric layer and the one of the first and second electrodes; and
  a first outer gap disposed outwardly of the active area and having a second spacing distance, different than the first spacing distance, between the piezoelectric layer and the one of the first and second electrodes,
wherein a second gap is disposed between the piezoelectric layer and the other of the first and second electrodes, and
wherein the second gap comprises:
  a second inner gap disposed in the active area, and having a third spacing distance between the piezoelectric layer and the other of the first and second electrodes, and
  a second outer gap disposed outwardly of the active area and having a fourth spacing distance, different than the third spacing distance, between the piezoelectric layer and the other of the first and second electrodes.

15. The bulk acoustic wave resonator of claim 14, wherein the piezoelectric layer and the one of the first and second electrodes form a first capacitor portion having a first capacitance in the first inner gap, and
  the piezoelectric layer and the one of the first and second electrodes form a second capacitor portion having a second capacitance different from the first capacitance peripheral to the first inner gap.

16. The bulk acoustic wave resonator of claim 15, wherein the piezoelectric layer and the other of the first and second electrodes form a third capacitor portion having a third capacitance in the second inner gap, and
  the piezoelectric layer and the other of the first and second electrodes form a fourth capacitor portion having a fourth capacitance different from the third capacitance peripheral to the second inner gap.

\* \* \* \* \*